United States Patent
Zuo et al.

(12) 
(10) Patent No.: US 11,640,190 B2
(45) Date of Patent: May 2, 2023

(54) LIQUID-ASSISTED AIR COOLING DESIGN WITH PARALLEL COLD PLATES AND SERIAL PUMPS

(71) Applicant: Dell Products L.P., Round Rock, TX (US)

(72) Inventors: Weidong Zuo, Shrewsbury, MA (US); Gemma Hui Chen, Shanghai (CN); Xiaoliang Zhou, Shanghai (CN); Mingming Zhang, Shanghai (CN); Jie Yang, Shanghai (CN)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/230,627

(22) Filed: Apr. 14, 2021

(65) Prior Publication Data
US 2022/0334623 A1    Oct. 20, 2022

(51) Int. Cl.
*G06F 1/20* (2006.01)
*H05K 7/20* (2006.01)

(52) U.S. Cl.
CPC ........... *G06F 1/20* (2013.01); *H05K 7/20254* (2013.01); *H05K 7/20263* (2013.01); *H05K 7/20272* (2013.01); *H05K 7/20509* (2013.01); *G06F 2200/201* (2013.01)

(58) Field of Classification Search
CPC . G06F 1/20; G06F 2200/201; H05K 7/20272; H05K 7/20254; H05K 7/20263; H05K 7/20509; H05K 7/20772; H05K 7/20781; H05K 7/2079; H05K 7/20763
See application file for complete search history.

(56) References Cited

U.S. PATENT DOCUMENTS

| | | | | |
|---|---|---|---|---|
| 2005/0160752 | A1* | 7/2005 | Ghoshal | H01L 35/00 62/118 |
| 2005/0180105 | A1* | 8/2005 | Matsushima | H01L 23/473 257/E23.098 |
| 2012/0279233 | A1* | 11/2012 | Chainer | H05K 7/20836 62/3.6 |
| 2014/0069614 | A1* | 3/2014 | Chiu | H01L 23/473 165/104.19 |
| 2022/0136775 | A1* | 5/2022 | Wu | F28D 17/00 165/104.25 |

* cited by examiner

*Primary Examiner* — Adam B Dravininkas
(74) *Attorney, Agent, or Firm* — Jackson Walker L.L.P.

(57) ABSTRACT

An information handling system includes two or more heat-generating devices and a liquid-assisted air cooling (LAAC) assembly to cool at least some of the devices. The LAAC assembly includes a radiator, first and second pumps connected in series with the radiator. The LAAC assembly further includes first and second cold plates enclosing first and second CPUs or another suitable heat generating device. The first and second cold plates are connected in parallel between an inlet of the first pump and an outlet of the second pump. In this configuration, the serial connected pumps in combination with the parallel connected cold plates provide 1+1 pump redundancy while delivering cold coolant from the radiator outlet to both heat generating devices such that neither heat cold plate receives pre-heated coolant from the other cold plate.

16 Claims, 4 Drawing Sheets

LIQUID-ASSISTED AIR COOLING DESIGN WITH PARALLEL COLD PLATES AND SERIAL PUMPS

TECHNICAL FIELD

The present disclosure relates to information handling systems and, more specifically, liquid-assisted cooling of information handling system components.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Semiconductor-based information handling system components, including processors, memory and other solid state storage devices, network switches, chipsets, field programmable gate arrays (FPGAs), and the like, generate heat as they conduct electrical current. Heat generated by an information handling system component can decrease the component's performance and reliability and may result in temporary or permanent failure. Accordingly, thermal management is an important consideration in the design and implementation of many information handling systems.

Air-cooled information handling systems have been well known and widely implemented for decades. Such systems typically employ one or more heat sinks physically and thermally coupled to one or more heat-generating components and one or more air movers, i.e., fans, to replace heated air in the vicinity of a heat-generating component for cooler air. More recently, the number of information handling systems employing liquid-assisted cooling has increased, particularly within high performance and power-dense environments such as a data center environments.

Liquid-assisted cooling requires dedicated equipment to circulate a liquid coolant between the heat generating component, where the coolant will be heated by the component, and a heat exchanging component where heat in the liquid coolant can at least partially dissipated to atmosphere and moved away from the component by one or more air movers. While it is generally desirable to minimize the amount of additional equipment required for liquid-assisted cooling, it is also important to maintain a highly available solution that can continue to perform even if one of the components is removed or fails.

SUMMARY

In accordance with teachings disclosed herein, common problems associated with implementing a highly available LAAC solution without adding cooling components and without preheating liquid coolant provided to any liquid-cooled device are addressed by a LAAC assembly disclosed herein.

In accordance with subject matter disclosed in the following description, an information handling system includes two or more heat-generating information handling devices and a liquid-assisted air cooling (LAAC) assembly to cool at least some of the information handling devices. The LAAC assembly includes a radiator to convert hot coolant received at a radiator inlet to cold coolant provided to a radiator outlet. The LAAC assembly further includes first and second pumps connected in series with the radiator wherein an outlet of the first pump is fluidically coupled to the radiator inlet and an inlet of the second pump is fluidically coupled to the radiator outlet. In at least one embodiment, the fluidic coupling between first pump outlet and the radiator inlet is an the only connection to either end point. Likewise, the fluidic coupling between the radiator outlet and the second pump inlet is the only connection to either of those points. The LAAC assembly may further include a fan assembly including one or more fans to move air through the radiator and cool the liquid coolant.

The LAAC assembly further includes first and second cold plates comprising a thermally conductive substrate and a housing to enclose a CPU or another suitable heat generating device. Each cold plate includes an inlet, an outlet, and at least one fluidic channel extending from the inlet to the outlet. In at least one embodiment, the first and second cold plates are connected in parallel between an inlet of the first pump and an outlet of the second pump. In this configuration, the serial connected pumps in combination with the parallel connected cold plates provide 1+1 pump redundancy while delivering cold coolant from the radiator outlet to both heat generating devices such that neither heat cold plate receives pre-heated coolant from the other cold plate. The parallel connected cold plates may be connected wherein outlets of the first and second cold plates are exclusively and fluidically coupled to the inlet of the first pump and wherein inlets of both cold plates are exclusively and fluidically coupled to an outlet of the second pump.

In an embodiment suitable for implementation in a data center or another power dense environment, the first and second devices may correspond to the first and second CPUs in a dual socket rack server configured to occupy one or more rack units of a server rack. In exemplary implementation, heated coolant from both cold plates is conveyed to the first pump inlet and neither cold plate receives pre-heated coolant from the other cold plate. In at least one embodiment, the first and second pumps provide redundancy wherein the second pump is configured to circulate coolant through the liquid cooling assembly when the first pump is non-functional and the first pump is configured to circulate coolant through the liquid cooling assembly when the second pump is non-functional.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
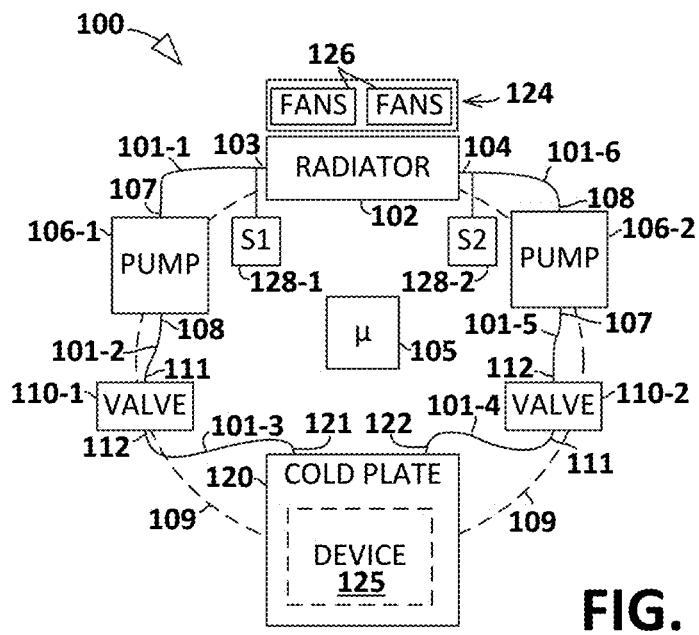
FIG. 1 Illustrates a block diagram of a liquid assisted air cooling assembly.

Exemplary embodiments and their advantages are best understood by reference to FIGS. 1-6, wherein like numbers are used to indicate like and corresponding parts unless expressly indicated otherwise.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit ("CPU"), microcontroller, or hardware or software control logic. Additional components of the information handling system may include one or more storage devices, one or more communications ports for communicating with external devices as well as various input/output ("I/O") devices, such as a keyboard, a mouse, and a video display. The information handling system may also include one or more buses operable to transmit communication between the various hardware components.

Additionally, an information handling system may include firmware for controlling and/or communicating with, for example, hard drives, network circuitry, memory devices, I/O devices, and other peripheral devices. For example, the hypervisor and/or other components may comprise firmware. As used in this disclosure, firmware includes software embedded in an information handling system component used to perform predefined tasks. Firmware is commonly stored in non-volatile memory, or memory that does not lose stored data upon the loss of power. In certain embodiments, firmware associated with an information handling system component is stored in non-volatile memory that is accessible to one or more information handling system components. In the same or alternative embodiments, firmware associated with an information handling system component is stored in non-volatile memory that is dedicated to and comprises part of that component.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, service processors, basic input/output systems (BIOSs), buses, memories, I/O devices and/or interfaces, storage resources, network interfaces, motherboards, and/or any other components and/or elements of an information handling system.

In the following description, details are set forth by way of example to facilitate discussion of the disclosed subject matter. It should be apparent to a person of ordinary skill in the field, however, that the disclosed embodiments are exemplary and not exhaustive of all possible embodiments.

Throughout this disclosure, a hyphenated form of a reference numeral refers to a specific instance of an element and the un-hyphenated form of the reference numeral refers to the element generically. Thus, for example, "device 12-1" refers to an instance of a device class, which may be referred to collectively as "devices 12" and any one of which may be referred to generically as "a device 12".

As used herein, when two or more elements are referred to as "coupled" to one another, such term indicates that such two or more elements are in electronic communication, mechanical communication, including thermal and fluidic communication, thermal, communication or mechanical communication, as applicable, whether connected indirectly or directly, with or without intervening elements.

Referring now to the drawings, FIG. 1 is a block diagram illustration of an LAAC assembly 100 suitable for cooling a heat generating device 125 of an information handling system (illustrated and described below with respect to FIG. 3). For the sake of clarity, information handling system components other than heat generating device 125 are omitted from FIG. 1. While all devices in which electrical current flows through a non-zero impedance generate at least some heat, devices identified herein as heat generating devices may refer more specifically to devices that generate a thermally significant quantity of heat. A thermally significant device may be defined, for at least some applications, based on the device's thermal design point (TDP) and thermally significant devices may refer to devices with a TDP exceeding a TDP threshold. The TDP threshold may vary based on various factors, but is generally greater than or equal to 50 W. Common types of heat generating devices are central processing units (CPUs) and graphics processing units (GPUs), but heat generating device 125 may be another type of device. For the sake of brevity and clarity, the exemplary information handling systems illustrated in the accompanying drawings identify each system's one or more CPUs as the heat generating device(s).

The LAAC assembly 100 illustrated in FIG. 1 includes various fluid handling components fluidically coupled to one another via fluidic conduits 101-1 through 101-6 that form a closed fluidic loop 109 suitable for circulating liquid coolant between a radiator 102 and one or more cold plates 120. Each cold plate 120 may be configured to enclose and cool a heat generating device 125. The LAAC assembly 100 illustrated in FIG. 1 further includes a fan assembly 124 including one or more fans 126 to exchange hot air in proximity to radiator 102 for cold air.

The LAAC assembly 100 illustrated in FIG. 1 includes a hot side, comprising the portion of loop 109 between radiator inlet 103 and cold plate outlet 121, and a cold side, comprising the portion of closed fluidic loop 109 between radiator outlet 104 and inlet 122 of cold plate 120.

The hot side of the LAAC assembly 100 illustrated in FIG. 1 includes an inlet 103 of radiator 102 fluidically coupled to an outlet 107 of first pump 106-1. An inlet 108 of first pump 106-1 is fluidically coupled to an outlet 111 of a first valve 110-1. An inlet 112 of first valve 110-1 is fluidically coupled to an outlet 121 of cold plate 120. On the cold side of LAAC assembly 100 includes an outlet 104 of radiator 102 fluidically coupled to an inlet 108 of second pump 106-2. An outlet 107 of second pump 106-2 is fluidically coupled to an inlet 112 of second valve 110-2. An outlet 111 of second valve 110-2 is fluidically coupled to an inlet 122 of cold plate 120.

In at least one embodiment, a microcontroller 105 of LAAC assembly 100 is communicatively coupled to pumps 16, valves 110, and sensors 128, two of which are depicted in FIG. 1 as a first sensor (S1) 128-1 and a second sensor (S2) 128-2, which may include one or more temperature sensors, one or more pressure sensors, one or more flow meters, and so forth. Microcontroller 105 may include or communicate with a thermal management module (not depicted in FIG. 1) and, based at least in part on sensory input from sensors 128, microcontroller 105 may control pumps 106, valves 110, and other devices to control the circulation of liquid coolant to cool heat generating device 125 and maintain thermal stability.

Those of ordinary skill will appreciate that the radiator 102 and the two pumps 106 of the LAAC assembly 100 illustrated in FIG. 1 are connected in series. In at least one embodiment, each pump 106 is sufficiently provisioned to circulate liquid coolant through closed fluidic loop 109 regardless of whether the other pump is functional. Such embodiments provide 1+1 pump redundancy in which the failure of either pump does not prevent liquid assisted cooling of the heat generating device 125.

Figure 2A:
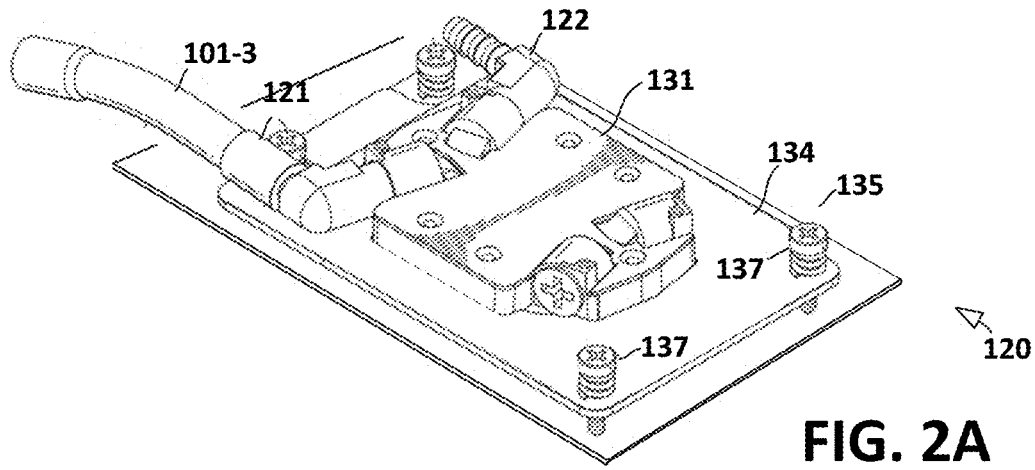
FIG. 2A illustrates a top perspective view of a cold plate.
Figure 2B:
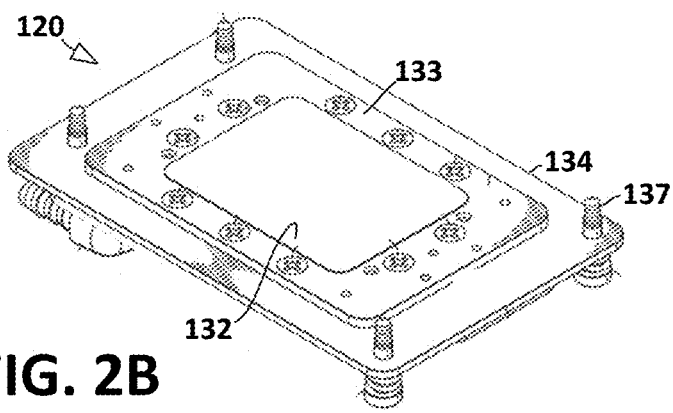
FIG. 2B illustrates a bottom perspective view of a cold plate

FIG. 2A and FIG. 2B illustrate top and bottom perspective views of an exemplary cold plate 120. The illustrated cold plate 120 includes a cold plate inlet 121 connected to a fluidic conduit 101-3, a cold plate outlet 122, and a cold plate housing 131 that defines a device cavity 132 suitable to engage a heat generating device (not depicted). The cold plate housing 131 is affixed to a cold plate base 133, which is attached to a load plate 134.

Load plate 134 is illustrated movably affixed, via setscrews 137, to a printed circuit board 135 to which a heat generating device 125 or a socket for receiving a heat generating device 125 may be affixed. The printed circuit board 135 may, in at least some embodiments, comprise a motherboard. Set screws 137 may be set to adjust the vertical spacing between load plate 134 and printed circuit board 135 and thereby force the heat generating device into thermal contact with housing 131.

It will be readily appreciated that the LAAC assembly 100 illustrated in FIG. 1 includes two pumps 106, but is configured to provide liquid assisted cooling to only a single heat generating device 125. In an increasing number of applications, however, it may be desirable to employ two or more CPUs or other types of heat generating devices and to provide liquid assisted cooling to each of the heat generating devices. In such systems, LAAC assembly 100 may provide liquid assisted cooling for two or more heat generating devices including a pair of heat generating devices in close physical proximity to one another and situated on a common substrate such as a motherboard, expansion card, or another suitable substrate. Because a dual socket server, in which the motherboard includes two CPU sockets, typically located side-by-side in close proximity to one another and each of which includes a corresponding CPU, is a prevalent example of an information handling system, the subject matter below may refer to dual socket servers as an exemplary system.

Figure 3:
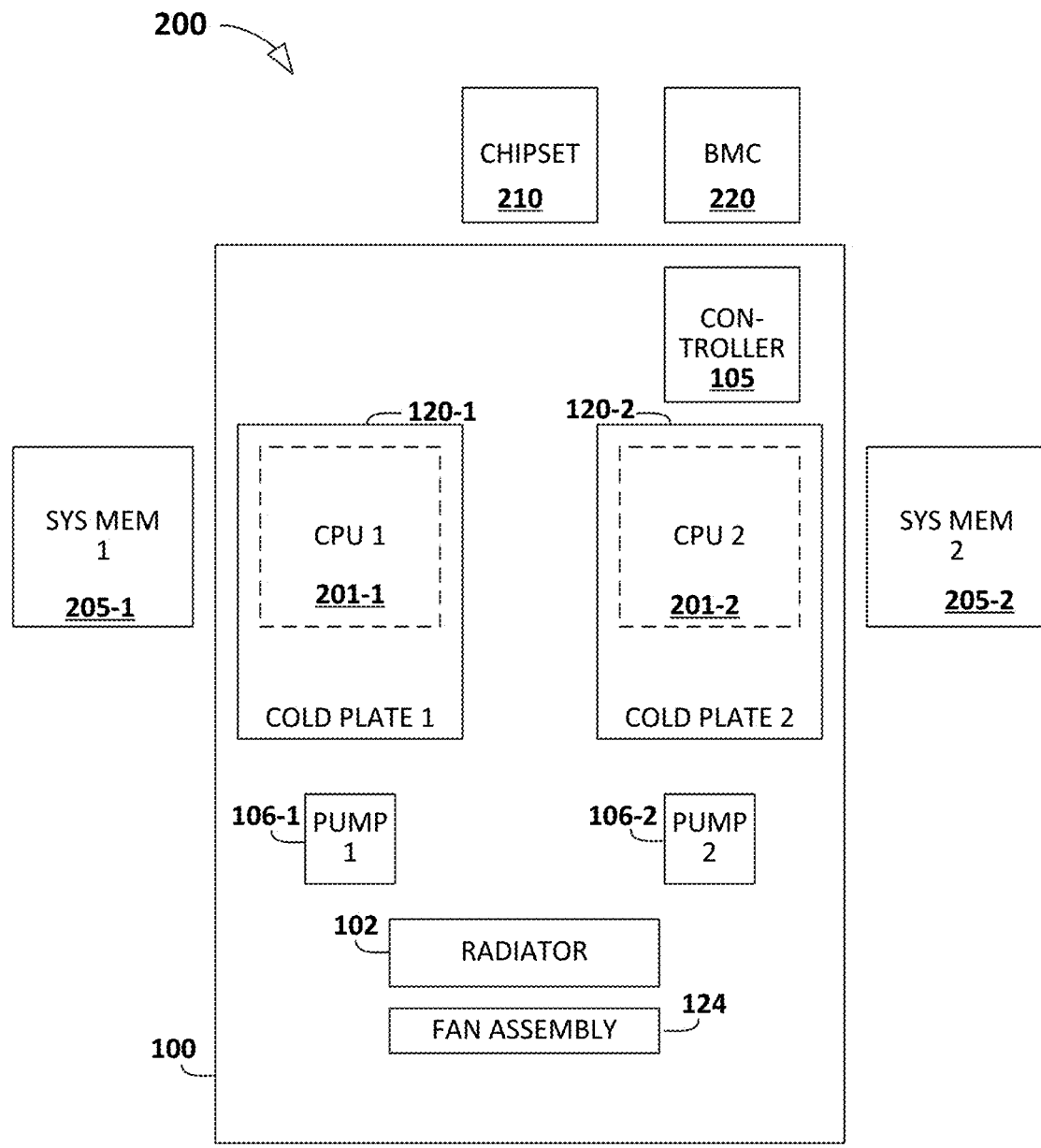
FIG. 3 illustrates a block diagram of an information handling system.

Referring now to FIG. 3, a block diagram of an information handling system is illustrated. The information handling system illustrated in FIG. 3 is a dual socket rack server 200 featuring a first CPU 201-1, a second CPU 201-2, and a LAAC assembly 100, which cools both CPUs 201. Rack server 200 further includes a first system memory 205-1, communicatively coupled to first CPU 201-1, a second system memory 205-2, communicatively coupled to second CPU 201-2, and a chipset 210 to which various storage devices and other peripheral devices may be connected. For the sake of clarity, the only device illustrated coupled to chipset is a baseboard management controller (BMC) 220. Like the LAAC assembly 100 illustrated in FIG. 1, the LAAC assembly 100 of FIG. 3 includes a radiator 102, a pair of fluidic pumps including a first pump 106-1 and a second pump 106-2, and a pair of cold plates 120, including a first cold plate 120-1 and a second cold plate 120-2.

Figure 4:
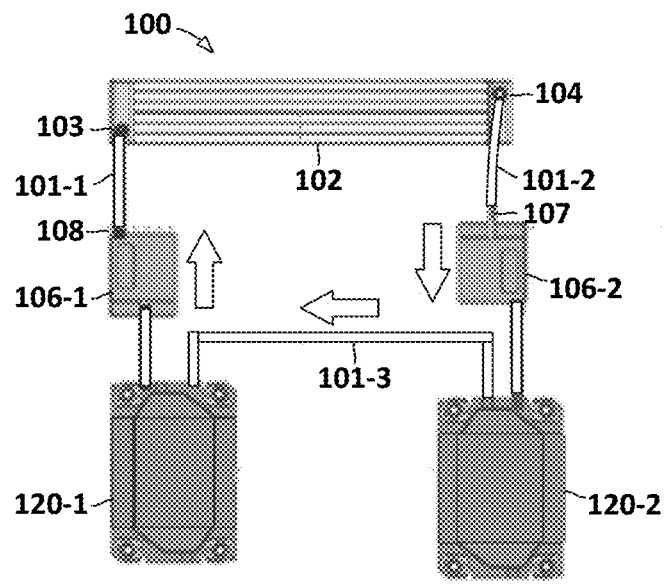
FIG. 4 illustrates a first configuration of a LAAC assembly.
Figure 5:
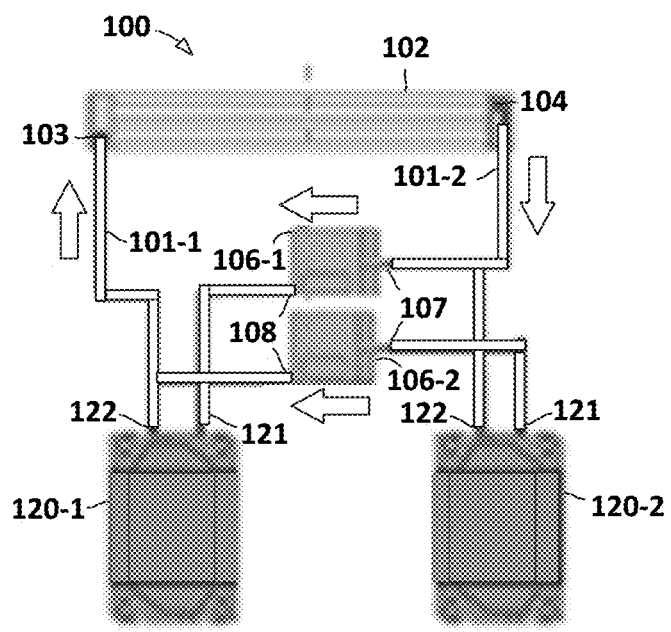
FIG. 5 illustrates a second configuration of a LAAC assembly.
Figure 6:
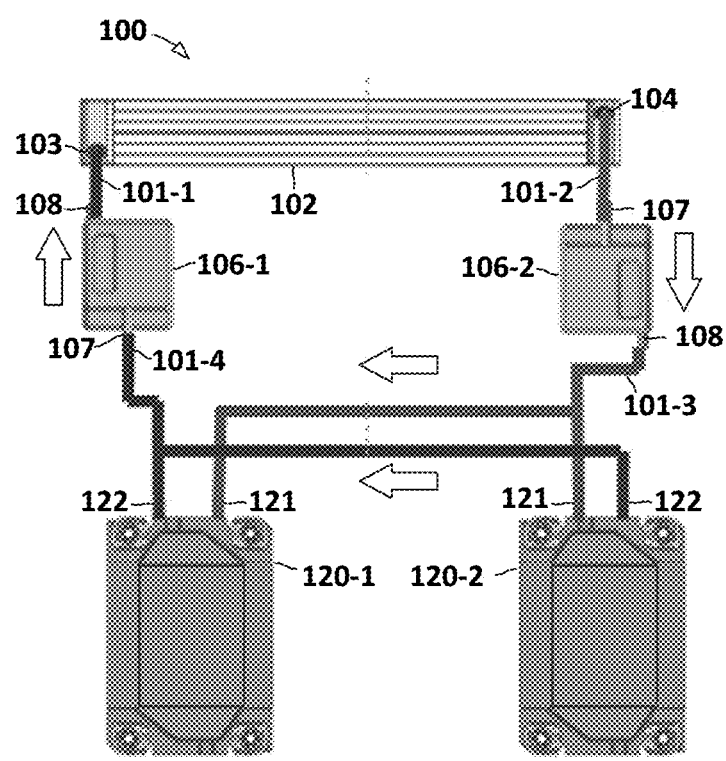
FIG. 6 illustrates a third configuration of a LAAC assembly.

The fluid handling components of the LAAC a100 illustrated in FIG. 3, including radiator 102, the pair of pumps 106, and the pair of cold plates 120, may be interconnected in different configurations, three of which are illustrated in FIG. 4, FIG. 5, and FIG. 6.

Referring now to FIG. 4, the illustrated LAAC assembly 100 includes first pump 106-1, radiator 102, and second pump 106-2 connected in series wherein an outlet 108 of first pump 106-1 is connected to an inlet 103 of radiator 102 via fluidic conduit 101-1 and an outlet 104 of radiator 102 is connected to an inlet 108 of second pump 106-2 by fluidic conduit 101-2. The embodiment of the LAAC assembly 100 illustrated in FIG. 4, like the LAAC assembly 100 of FIG. 1, achieves 1+1 pump redundancy. In the event of a single pump failure, the remaining pump is sufficient to circulate liquid coolant and maintain liquid assisted cooling. However, those of ordinary skill will recognize that the coolant provided to first cold plate 120-1 via fluidic conduit 101-3 is pre-heated by the CPU (not explicitly depicted) enclosed by second cold plate 120-2. Whereas cold coolant from radiator outlet 104 is provided directly to second cold plate 120-2, the coolant received by first cold plate 120-1 is provided by the outlet of second cold plate 120-2.

Referring now to FIG. 5, a parallel cold plate embodiment of LAAC assembly 100 is illustrated. In the LAAC assembly 100 illustrated in FIG. 5, the radiator inlet 103 receives heated coolant from two sources and the radiator outlet 104 provides cold coolant to two sources. Specifically, radiator inlet 103 receives heated coolant from outlet 122 of first cold plate 120-1 and from outlet 108 of second pump 106-2. The radiator outlet 104 provides coolant to an inlet 107 of first pump 106-1 and to inlet 121 of second cold plate 120-2. The LAAC assembly 100 illustrated in FIG. 5 addresses the preheating issue associated with LAAC assembly 100 of FIG. 4. It will be noted, however, that the parallel configuration illustrated in FIG. 5 no longer qualifies as highly available due to the absence of pump redundancy. If first pump 106-1 fails, coolant is no longer circulated to first cold plate 120-1. Similarly, if second pump 106-2 fails, coolant is no longer circulated to second cold plate 120-2.

Referring now to FIG. 6, a serial pump, parallel cold plate embodiment of LAAC assembly 100 is illustrated. In the LAAC assembly 100 illustrated in FIG. 6, an outlet of first pump 106-1 is connected to the radiator inlet 103, the radiator outlet 104 is connected to an inlet of second pump 106-2. The outlet of second pump 106-2 is coupled to an inlets 121 of both cold plates 120. Outlets 122 of both cold plates 120 are coupled to the inlet 107 of first pump 106-2. The embodiment of LAAC assembly 100 illustrated in FIG. 6 beneficially avoids the preheating issue associated with the embodiment illustrated in FIG. 4 while maintaining pump redundancy, all without additional cooling hardware over either of the embodiments illustrated in FIG. 4 and FIG. 5. If first pump 106-1 fails, circulation of coolant to both cold plates 120 is maintained by second pump 106-2. Similarly, if second pump 106-2 fails, circulation of coolant to both cold plates 120 is maintained by first pump 106-1. In addition, in no case is preheated coolant provided to either of the cold plates 120. Instead, both cold plates 120 receive cold coolant from radiator outlet 104 via second pump 106-2.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. An information handling system, comprising:
  a pair of heat-generating information handling devices, including a first device and a second device; and
  a liquid-assisted air cooling (LAAC) assembly to dissipate heat generated by at least one of the first device and the second device, wherein the LAAC assembly includes:
    a radiator to convert hot coolant received at a radiator inlet to cold coolant provided to a radiator outlet;
    a first pump and a second pump connected in series with the radiator wherein:
      a first pump outlet is fluidically coupled to the radiator inlet; and
      a second pump inlet is fluidically coupled to the radiator outlet;
    a first cold plate, thermally coupled to the first device, and a second cold plate, thermally coupled to the second device, wherein the first cold plate includes a first cold plate housing defining a first device cavity engaging the first device and wherein the second cold plate includes a second cold plate housing defining a second device cavity engaging the second device, wherein the first and second cold plates are connected in parallel between a first pump inlet and a second pump outlet.

2. The information handling system of claim 1, wherein:
  a first cold plate outlet and a second cold plate outlet are both fluidically coupled to an inlet of the first pump; and a first cold plate inlet and a second cold plate inlet are both fluidically coupled to an outlet of the second pump.

3. The information handling system of claim 1, wherein:
  the first pump outlet is fluidically coupled to the radiator inlet exclusively;
  the second pump inlet is fluidically coupled to the radiator outlet exclusively;
  the cold plate outlets are fluidically coupled to the first pump inlet exclusively; and
  the cold plate inlets are fluidically coupled to the second pump outlet exclusively.

4. The information handling system of claim 1, wherein the LAAC assembly further includes:
  a fan assembly including one or more fans to exchange hot air in proximity to the radiator for cold air.

5. The information handling system of claim 1, wherein the first device and the second device are first and second components of a rack information handling resource and further wherein the rack information handling system is configured to occupy one or more rack units of a server rack.

6. The information handling system of claim 5, wherein the rack information handling resource comprises a dual socket rack server and wherein the first device comprises a first central processing unit (CPU) of the dual socket rack server and the second device comprise a second CPU of the dual socket rack server.

7. The information handling system of claim 1, wherein heated coolant from both cold plates is provided to the first pump inlet and neither cold plate receives heated coolant from the other cold plate.

8. The information handling system of claim 1, wherein the first and second pumps are redundant wherein the second pump is configured to circulate coolant through the liquid cooling assembly when the first pump is non-functional and the first pump is configured to circulate coolant through the liquid cooling assembly when the second pump is non-functional.

9. A liquid-assisted air cooling (LAAC) assembly to cool heat-generating devices in an infoiniation handling system, wherein the LAAC assembly comprises:
  a radiator to convert hot coolant received at a radiator inlet to cold coolant provided to a radiator outlet;
  a first pump and a second pump connected in series with the radiator wherein:

a first pump outlet is fluidically coupled to the radiator inlet; and
a second pump inlet is fluidically coupled to the radiator outlet;
a first cold plate including a first cold plate housing defining a first device cavity to engage a first heat-generating device, and a second cold plate including a first cold plate housing defining a first device cavity to engage a second heat-generating device, wherein the first and second cold plates are connected in parallel between a first pump inlet and a second pump outlet.

10. The assembly of claim 9, wherein:
a first cold plate outlet and a second cold plate outlet are both fluidically coupled to an inlet of the first pump; and a first cold plate inlet and a second cold plate inlet are both fluidically coupled to an outlet of the second pump.

11. The assembly of claim 9, wherein:
the first pump outlet is fluidically coupled to the radiator inlet exclusively;
the second pump inlet is fluidically coupled to the radiator outlet exclusively;
the cold plate outlets are fluidically coupled to the first pump inlet exclusively; and
the cold plate inlets are fluidically coupled to the second pump outlet exclusively.

12. The assembly of claim 9, wherein the LAAC assembly further includes:
a fan assembly including one or more fans to exchange hot air in proximity to the radiator for cold air.

13. The assembly of claim 9, wherein the first heat-generating device and the second heat-generating device are first and second components of a rack information handling resource and further wherein the rack information handling system is configured to occupy one or more rack units of a server rack.

14. The assembly of claim 13, wherein the rack information handling resource comprises a dual socket rack server and wherein the first heat-generating device comprises a first central processing unit (CPU) of the dual socket rack server and the second heat-generating device comprise a second CPU of the dual socket rack server.

15. The assembly of claim 9, wherein heated coolant from both cold plates is provided to the first pump inlet and neither cold plate receives heated coolant from the other cold plate.

16. The assembly of claim 9, wherein the first and second pumps are redundant wherein the second pump is configured to circulate coolant through the liquid cooling assembly when the first pump is non-functional and the first pump is configured to circulate coolant through the liquid cooling assembly when the second pump is non-functional.

* * * * *

UNITED STATES PATENT AND TRADEMARK OFFICE
CERTIFICATE OF CORRECTION

PATENT NO. : 11,640,190 B2
APPLICATION NO. : 17/230627
DATED : May 2, 2023
INVENTOR(S) : Zuo et al.

It is certified that error appears in the above-identified patent and that said Letters Patent is hereby corrected as shown below:

In the Claims

In Column 8, Line 62, Claim 9 delete "infoiniation" and insert -- information --, therefor.

Signed and Sealed this
Thirteenth Day of June, 2023

Katherine Kelly Vidal
*Director of the United States Patent and Trademark Office*